US012727123B2

(12) United States Patent
Hsu et al.

(10) Patent No.: US 12,727,123 B2
(45) Date of Patent: Sep. 1, 2026

(54) COOLING DEVICE AND COOLING SYSTEM

(71) Applicant: PEGATRON CORPORATION, Taipei City (TW)

(72) Inventors: Ta-Yung Hsu, Taipei City (TW); Chun-Cheng Chang, Taipei City (TW); Jen-Chieh Shih, Taipei City (TW)

(73) Assignee: PEGATRON CORPORATION, Taipei City (TW)

( * ) Notice: Subject to any disclaimer, the term of this patent is extended or adjusted under 35 U.S.C. 154(b) by 281 days.

(21) Appl. No.: 18/743,674

(22) Filed: Jun. 14, 2024

(65) Prior Publication Data

US 2025/0126759 A1 Apr. 17, 2025

(30) Foreign Application Priority Data

Oct. 13, 2023 (TW) ................................ 112139245

(51) Int. Cl.
*H05K 7/20* (2006.01)

(52) U.S. Cl.
CPC ................................ *H05K 7/20763* (2013.01)

(58) Field of Classification Search
CPC ........... H05K 7/20763; H05K 7/20781; H05K 7/20236; H05K 7/203; H05K 7/20272
See application file for complete search history.

(56) References Cited

U.S. PATENT DOCUMENTS

| | | | | |
|---|---|---|---|---|
| 10,653,036 B1 * | 5/2020 | Gao | .................. | H05K 7/20281 |
| 11,006,547 B2 * | 5/2021 | Gao | .......................... | G06F 1/20 |
| 2020/0037467 A1 * | 1/2020 | Ishinabe | ............ | H05K 7/20236 |
| 2022/0361381 A1 * | 11/2022 | Sweeney | ............ | H05K 7/20236 |
| 2023/0042343 A1 * | 2/2023 | Hashimoto | ........ | H05K 7/20272 |
| 2023/0413473 A1 * | 12/2023 | Chen | .................. | H05K 7/20781 |
| 2024/0057286 A1 * | 2/2024 | Lin | .................... | H05K 7/20645 |
| 2025/0107036 A1 * | 3/2025 | Lee | .................... | H05K 7/20254 |
| 2025/0344341 A1 * | 11/2025 | Boyd | ................ | H05K 7/20781 |

FOREIGN PATENT DOCUMENTS

| | | |
|---|---|---|
| CN | 108882652 A | 11/2018 |
| CN | 111065245 A | 4/2020 |
| CN | 111465257 A | 7/2020 |
| CN | 113473823 A | 10/2021 |
| TW | 202203736 A | 1/2022 |

* cited by examiner

*Primary Examiner* — Stephen S Sul
(74) *Attorney, Agent, or Firm* — MUNCY, GEISSLER, OLDS & LOWE, P.C.

(57) ABSTRACT

The present invention discloses a cooling device including an accommodating tank, a turbulence plate, an adjustment structure and a control mechanism. The accommodating tank is adapted to accommodate a coolant. The turbulence plate divides the accommodating tank into a liquid inlet space and a cooling space. The turbulence plate includes a groove that divides the turbulence plate into a first plate portion and a second plate portion. The adjustment structure includes an adjustment plate corresponding to the groove. The control mechanism controls the adjustment plate to move between a first position and a second position, where when the adjustment plate moves from the first position to the second position, the adjustment plate passes through the groove and enters the liquid inlet space, to divide the liquid inlet space into a first chamber corresponding to the first plate portion and a second chamber corresponding to the second plate portion.

15 Claims, 12 Drawing Sheets

COOLING DEVICE AND COOLING SYSTEM

CROSS REFERENCE TO RELATED APPLICATIONS

This application claims the priority benefit of Taiwan application serial no. 112139245, filed on Oct. 13, 2023. The entirety of the above-mentioned patent application is hereby incorporated by reference herein and made a part of this specification.

BACKGROUND

Technical Field

The present invention relates to a cooling system and a cooling device, and in particular, to an immersion cooling system and a cooling device that are used for cooling servers.

Description of Related Art

Immersion cooling is one of liquid cooling technologies. For example, a server is directly immersed in a non-conductive coolant, and after thermal energy generated by components of the server is conducted to the coolant, the coolant with an increased temperature is cooled in a circulating cooling manner, and flows back to continue to absorb the thermal energy of the server. Therefore, the server can be cooled without another active cooling component (for example, a fan), helping improve energy efficiency.

In conventional methods, a plurality of servers is directly disposed in an accommodating tank of a coolant, Through the flow of the coolant pushed by a pump, the coolant with a low temperature is able to enter the accommodating tank, and the coolant whose temperature has been increased in the accommodating tank is discharged for cooling, to achieve a purpose of cooling the servers through heat exchange of the coolant. However, in existing methods, regardless of heating wattage of different servers, or whether a position of a server disposed in the accommodating tank is close to inlets and outlets of cold and hot coolants, the servers are directly disposed in the accommodating tank, and it is expected that all heat generated by the different servers can be cooled by the coolant in the slot, to achieve a purpose of temperature reduction. However, in an actual situation, due to different amounts of heat generated by the different servers, different positions of the servers disposed in the accommodating tank, or different flow amounts of the coolant flowing through the servers caused by different structures of the servers, heat dissipation efficiency in each server is inconsistent, leading to a risk of local overheating of the server and a requirement for increased pump power consumption.

Therefore, how to provide a cooling system that can adjust heat dissipation efficiency of servers at different positions in an accommodating tank based on a requirement, and avoid a risk of increased pump power consumption caused by a requirement for increasing a flow rate of a coolant due to local overheating of the servers is a problem of considerable importance in the industry.

SUMMARY

In view of the foregoing problem, an objective of the present invention is to provide a cooling device and a cooling system, which can adjust heat dissipation efficiency of servers at different positions in an accommodating tank based on a requirement. In addition, a problem of overheating of local hot spots in the servers and a requirement for increased pump power consumption can be avoided.

To achieve the foregoing objective, the present invention provides a cooling device including an accommodating tank, a turbulence plate, an adjustment structure, and a control mechanism. The accommodating tank is adapted to accommodate a coolant. The turbulence plate is disposed in the accommodating tank, to divide the accommodating tank into a liquid inlet space and a cooling space, the turbulence plate includes a groove, the groove divides the turbulence plate into a first plate portion and a second plate portion, and the first plate portion and the second plate portion are opposite to each other, and have a plurality of communication holes communicating the liquid inlet space with the cooling space. The adjustment structure is movably disposed in the accommodating tank, and includes an adjustment plate corresponding to the groove. The control mechanism is disposed at the accommodating tank, and connected to the adjustment structure, where the control mechanism is adapted to control the adjustment plate to move between a first position and a second position, where when the adjustment plate moves from the first position to the second position, the adjustment plate passes through the groove and enters the liquid inlet space, to divide the liquid inlet space into a first chamber corresponding to the first plate portion and a second chamber corresponding to the second plate portion.

To achieve the foregoing objective, the present invention provides a cooling system including at least two servers, an accommodating tank, a turbulence plate, an adjustment structure, and a control mechanism. The accommodating tank is adapted to accommodate the servers and a coolant. The turbulence plate is disposed in the accommodating tank, to divide the accommodating tank into a liquid inlet space and a cooling space, wherein the servers are located in the cooling space, the turbulence plate includes a groove, the groove divides the turbulence plate into a first plate portion and a second plate portion, and the first plate portion and the second plate portion are opposite to each other, and have a plurality of communication holes communicating the liquid inlet space and the cooling space. The adjustment structure is movably disposed in the accommodating tank, and includes an adjustment plate corresponding to the groove. The control mechanism is disposed at the accommodating tank, and connected to the adjustment structure, where the control mechanism is adapted to control the adjustment plate to move between a first position and a second position, where when the adjustment plate moves from the first position to the second position, the adjustment plate passes through the groove and enters the liquid inlet space, to divide the liquid inlet space into a first chamber corresponding to the first plate portion and a second chamber corresponding to the second plate portion.

In an embodiment, the accommodating tank includes a liquid inlet pipeline and a converging space connected to the liquid inlet pipeline, and the converging space communicates with the first chamber.

In an embodiment, the cooling device (cooling system) further includes a first baffle and a second baffle, where the first baffle and the second baffle are respectively disposed in the first chamber and the second chamber and extending in an extension direction of the groove, where thicknesses of the first baffle and the second baffle gradually increase in a direction away from the liquid inlet pipeline.

In an embodiment, the control mechanism includes a controller, the adjustment structure further includes a connection portion, two ends of the connection portion are respectively connected to the controller and the adjustment plate, and the controller is fixed to a top of the accommodating tank, and drives the adjustment plate to move between the first position and the second position by using the connection portion.

In an embodiment, the controller includes an adjustment rod perpendicular to the turbulence plate and a mating piece disposed corresponding to the adjustment rod, the connection portion further includes a bent region, the mating piece is connected to the bent region of the connection portion, and an end of the adjustment rod passes through the mating piece and the bent region.

In an embodiment, when the adjustment rod is rotated, the adjustment rod drives the adjustment plate to move between the first position and the second position by using the mating piece and the connection portion.

In an embodiment, the controller further includes a driving piece, and the driving piece is adapted to drive the adjustment rod to rotate.

In an embodiment, the controller further includes a fixing base and a guide piece, the fixing base is disposed at the top of the accommodating tank and has a guide slot, an extension direction of the guide slot is perpendicular to the turbulence plate, another end of the adjustment rod is connected to the fixing base, and the guide piece is fixed to the connection portion and movably penetrates the guide slot.

In an embodiment, the cooling device further includes a baffle plate, where the baffle plate is located in the cooling space and is disposed on the turbulence plate in an extension direction of the groove.

In an embodiment, a position of one of the servers in the cooling space corresponds to the first plate portion, and a position of another one of the servers in the cooling space corresponds to the second plate portion.

In an embodiment, a position of one of the servers in the cooling space corresponds to the first plate portion, and a position of another one of the servers in the cooling space corresponds to the second plate portion; and the controller further includes a sensing unit connected to the driving piece, where the sensing unit is adapted to sense temperatures of the servers, and when a temperature of the one of the servers corresponding to the first plate portion is greater than a temperature of the another one of the servers corresponding to the second plate portion, the driving piece drives the adjustment rod to rotate to cause the adjustment plate to move from the first position to the second position.

As described above, in the cooling device and the cooling system of the present invention, the control mechanism controls the adjustment structure (adjustment plate) to move between the first position and the second position, where when the control mechanism controls the adjustment plate to move from the first position to the second position, the adjustment plate passes through the groove of the turbulence plate and enters the liquid inlet space, to divide the liquid inlet space into the first chamber and the second chamber respectively corresponding to the first plate portion and the second plate portion of the turbulence plate, so that the cooling system of the present invention can change a flow direction of the coolant entering the accommodating tank, and adjust a flow amount of the coolant entering the cooling space from the first chamber and the second chamber, to achieve better heat dissipation efficiency in cooperation with heat dissipation requirements of the servers at different positions. In addition, a problem of increased pump power consumption caused by a requirement for increasing a flow rate of the coolant due to overheating of local hot spots in the servers can be avoided.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION

Figure 1:
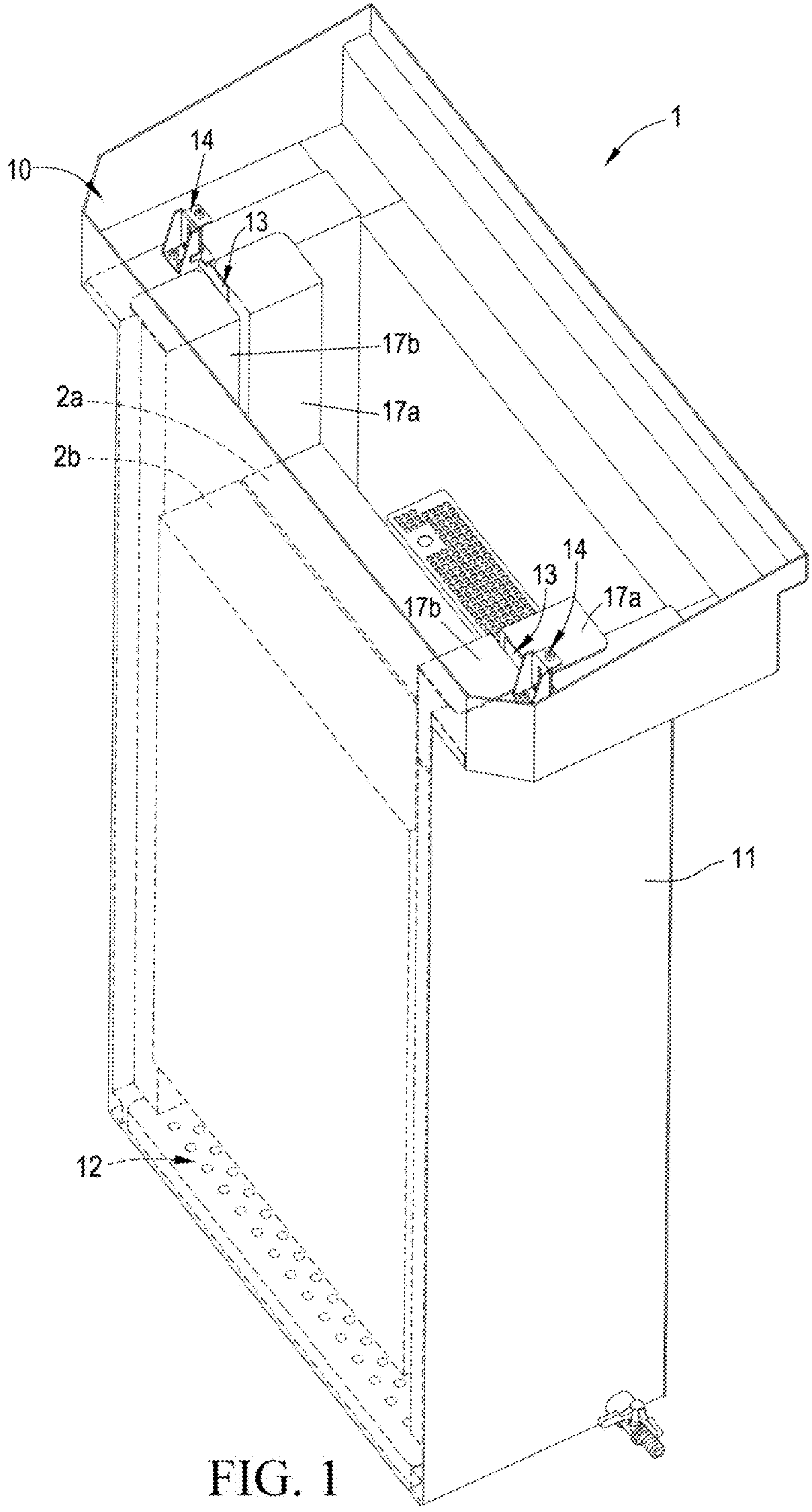
FIG. 1 is a three-dimensional schematic diagram of a cooling system according to an embodiment of the present invention.

The following describes a cooling device and a cooling system according to embodiments of the present invention with reference to relevant drawings, where same elements are described with same reference numerals. Elements appearing in the following embodiments are merely used to describe a relative relationship, and do not represent a proportion or a size of a real element.

Figure 2:
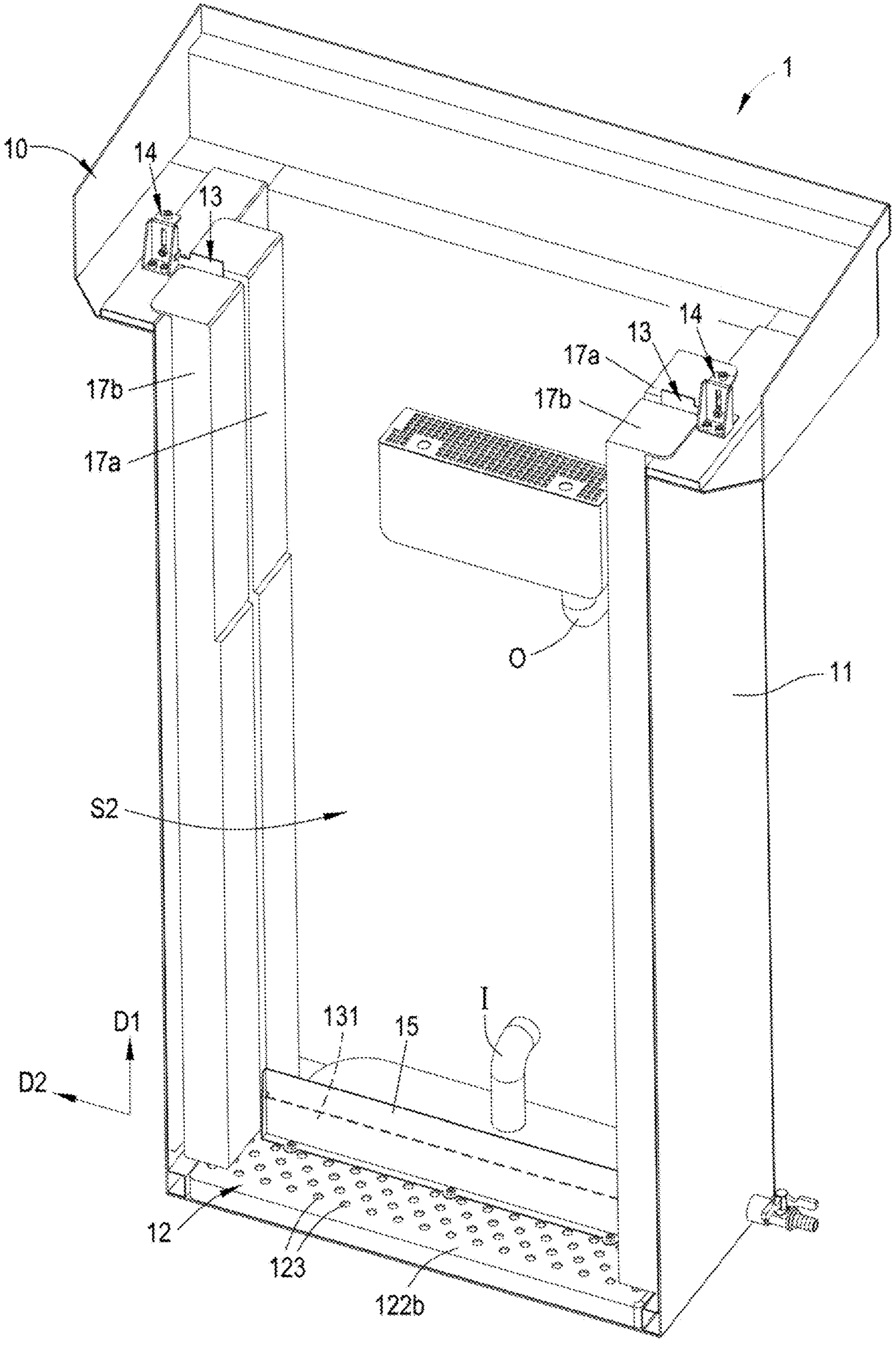
FIG. 2 and FIG. 3 are respectively partial three-dimensional schematic diagrams of the cooling system in FIG. 1.
Figure 3:
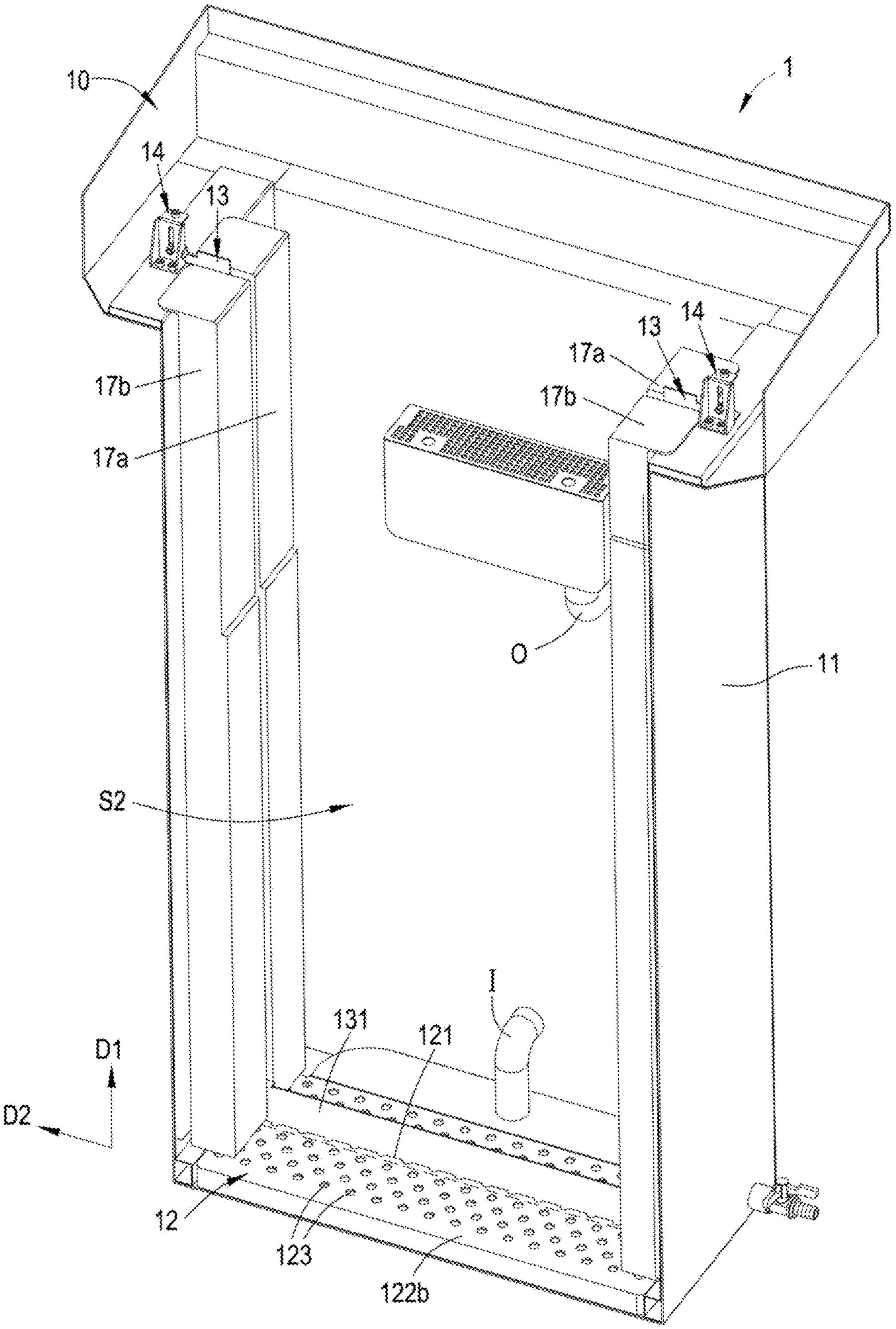
Figure 4:
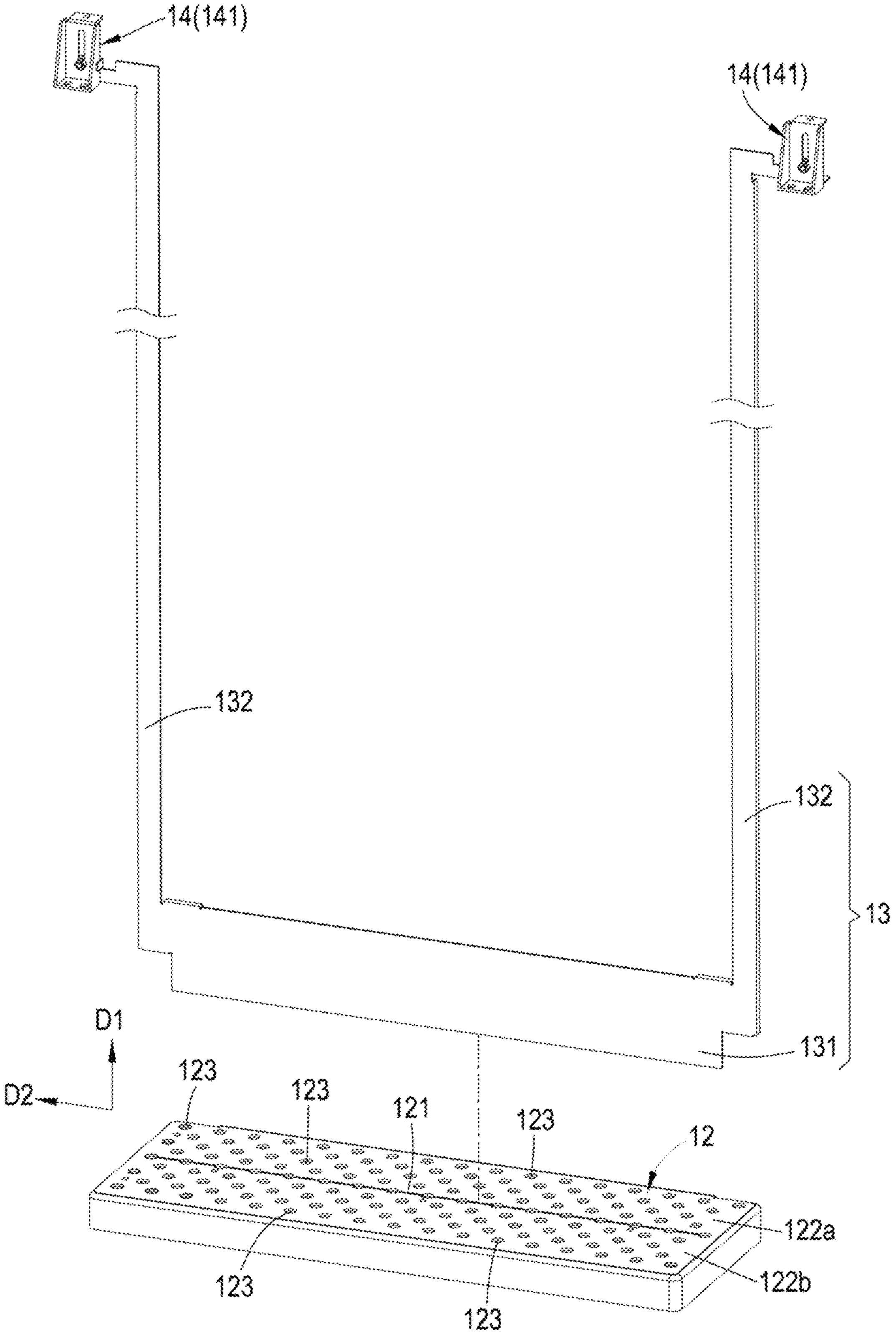
FIG. 4 is a schematic diagram of a relationship among a turbulence plate, an adjustment structure, and a control mechanism of a cooling device in the cooling system in FIG. 1.
Figure 5:
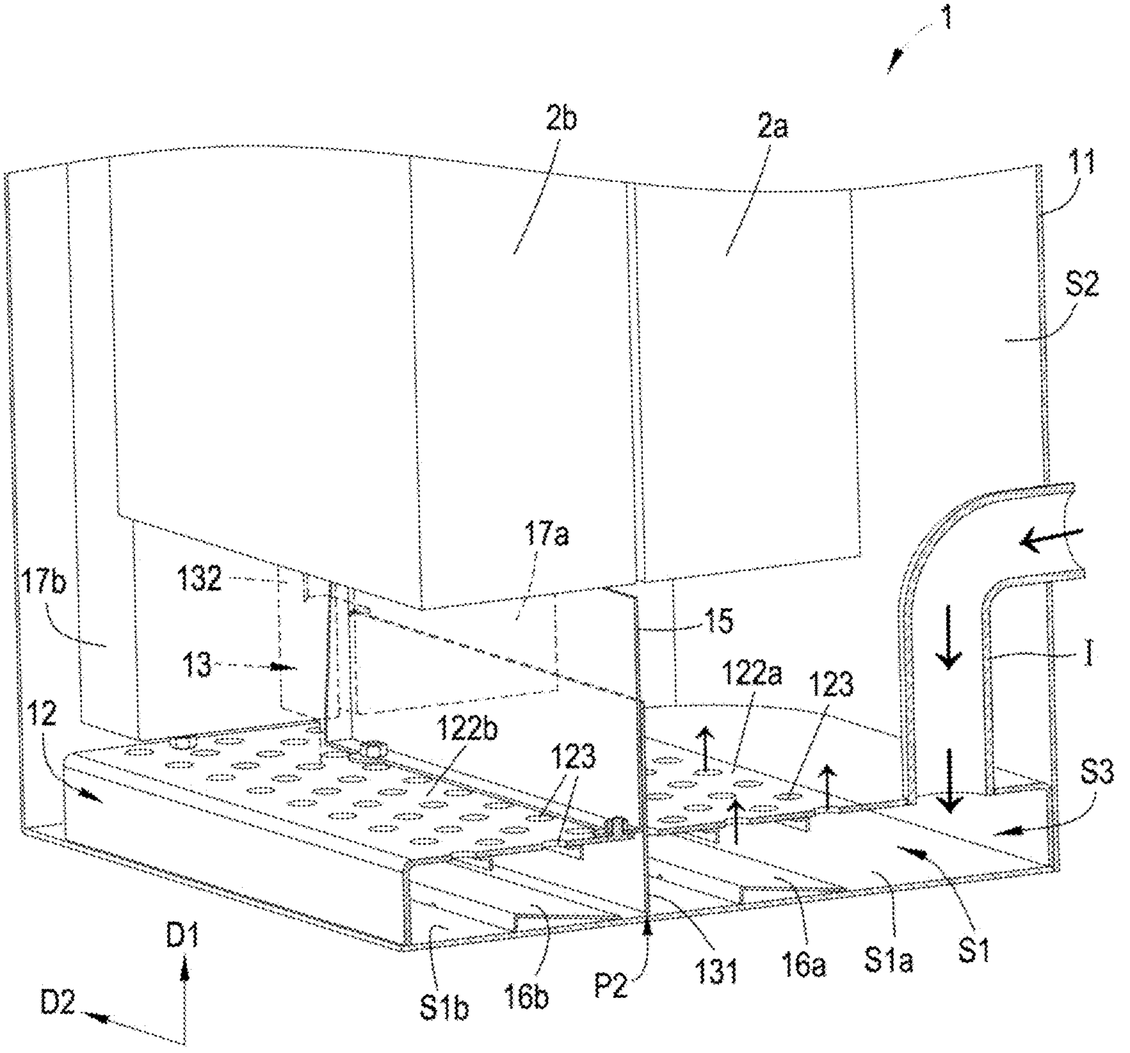
FIG. 5 is a partial three-dimensional schematic diagram of the cooling system in FIG. 1.
Figure 6A:
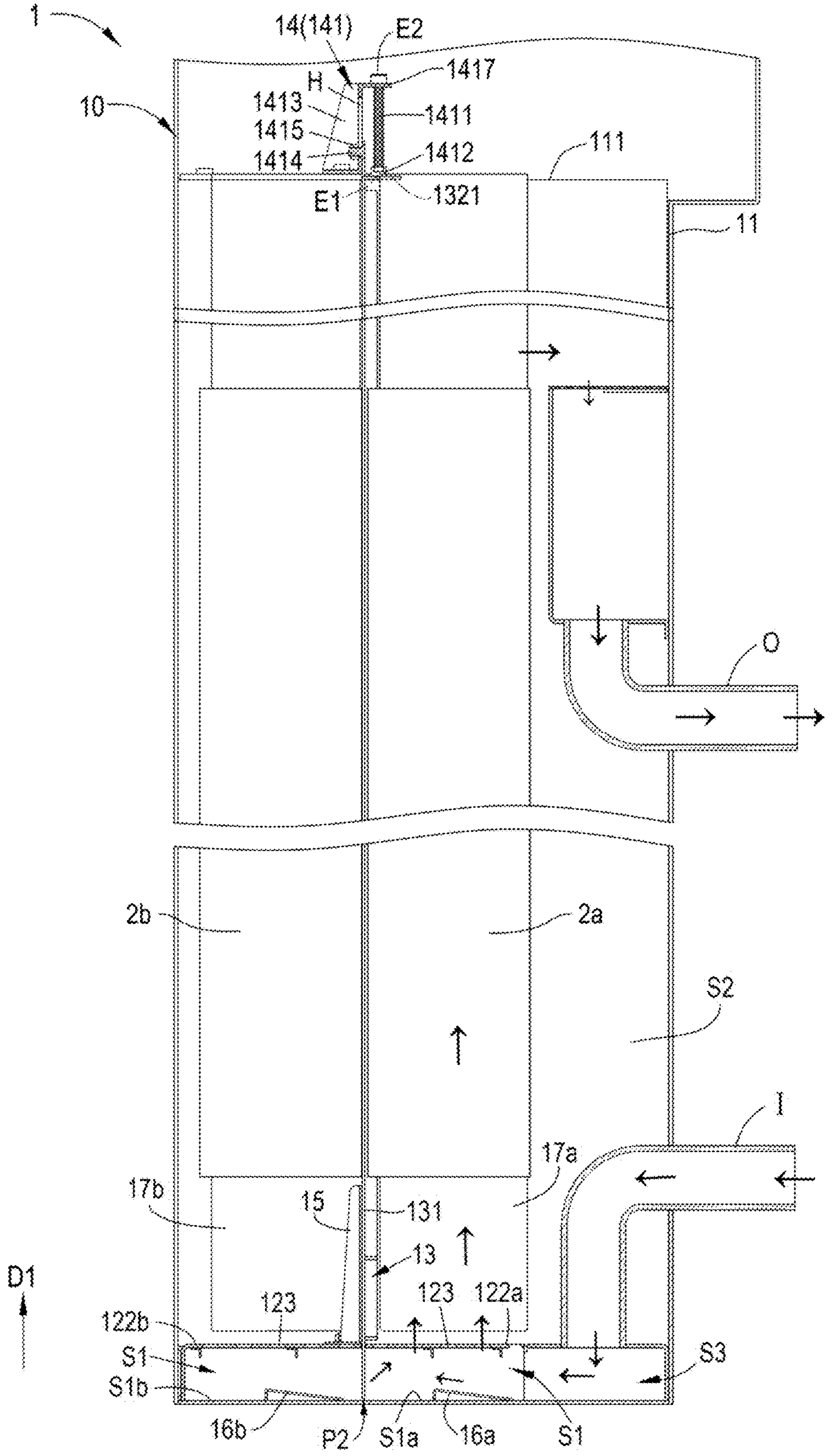
FIG. 6A is a schematic cross-sectional view of an adjustment plate that is of an adjustment structure of a cooling device in the cooling system in FIG. 1 and that is at a second position.
Figure 6B:
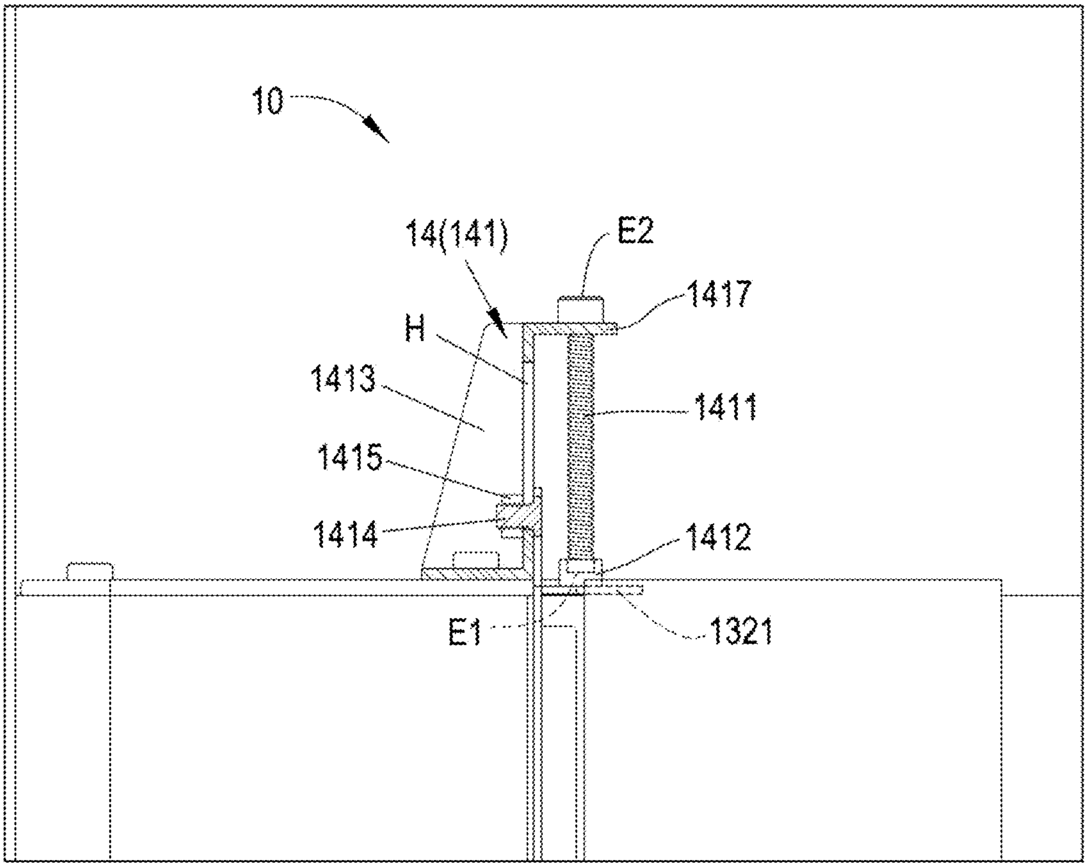
FIG. 6B is a schematic enlarged view of a control mechanism in FIG. 6A.
Figure 6C:
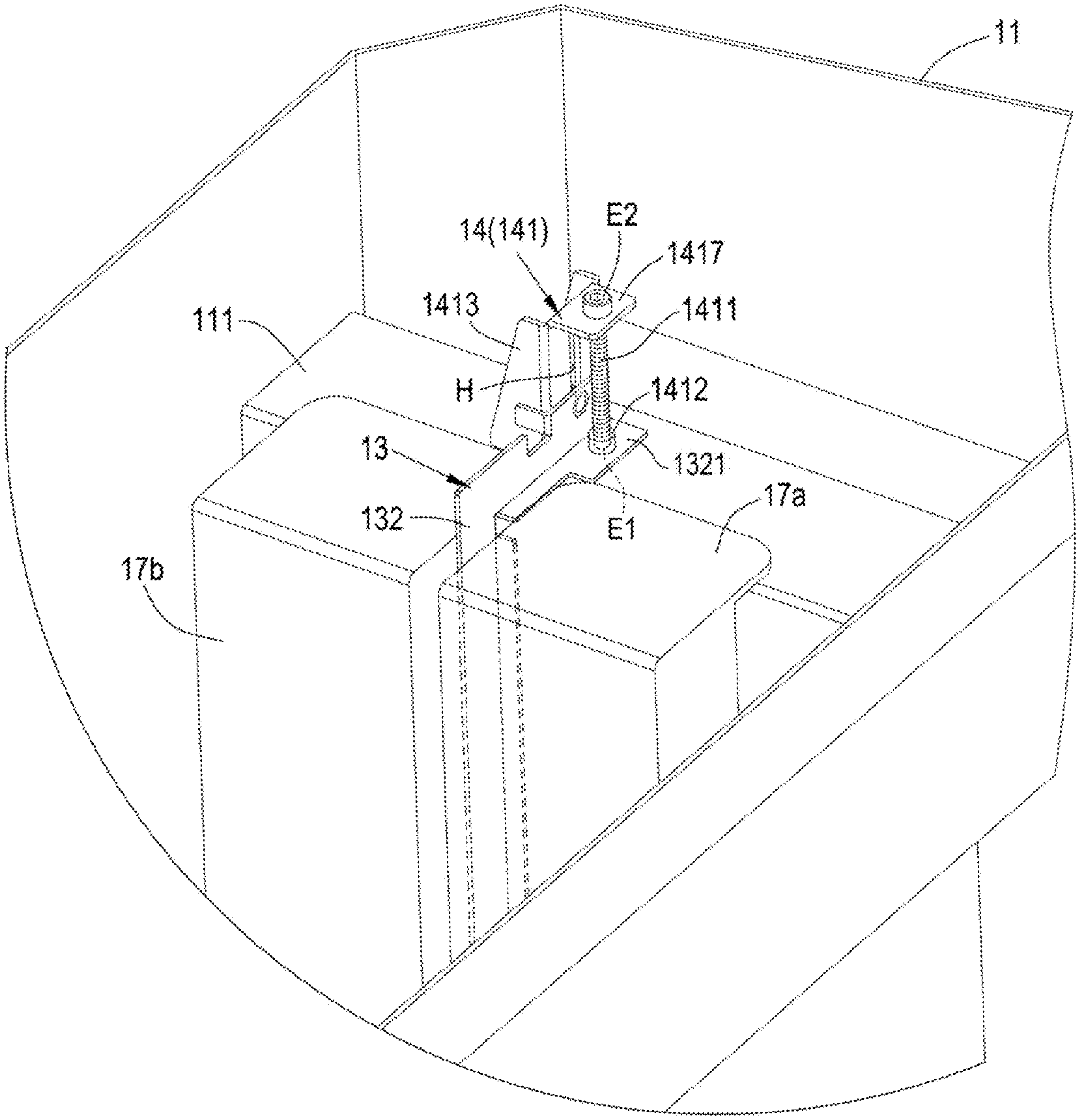
FIG. 6C is a schematic partial enlarged view of FIG. 6A.
Figure 6D:
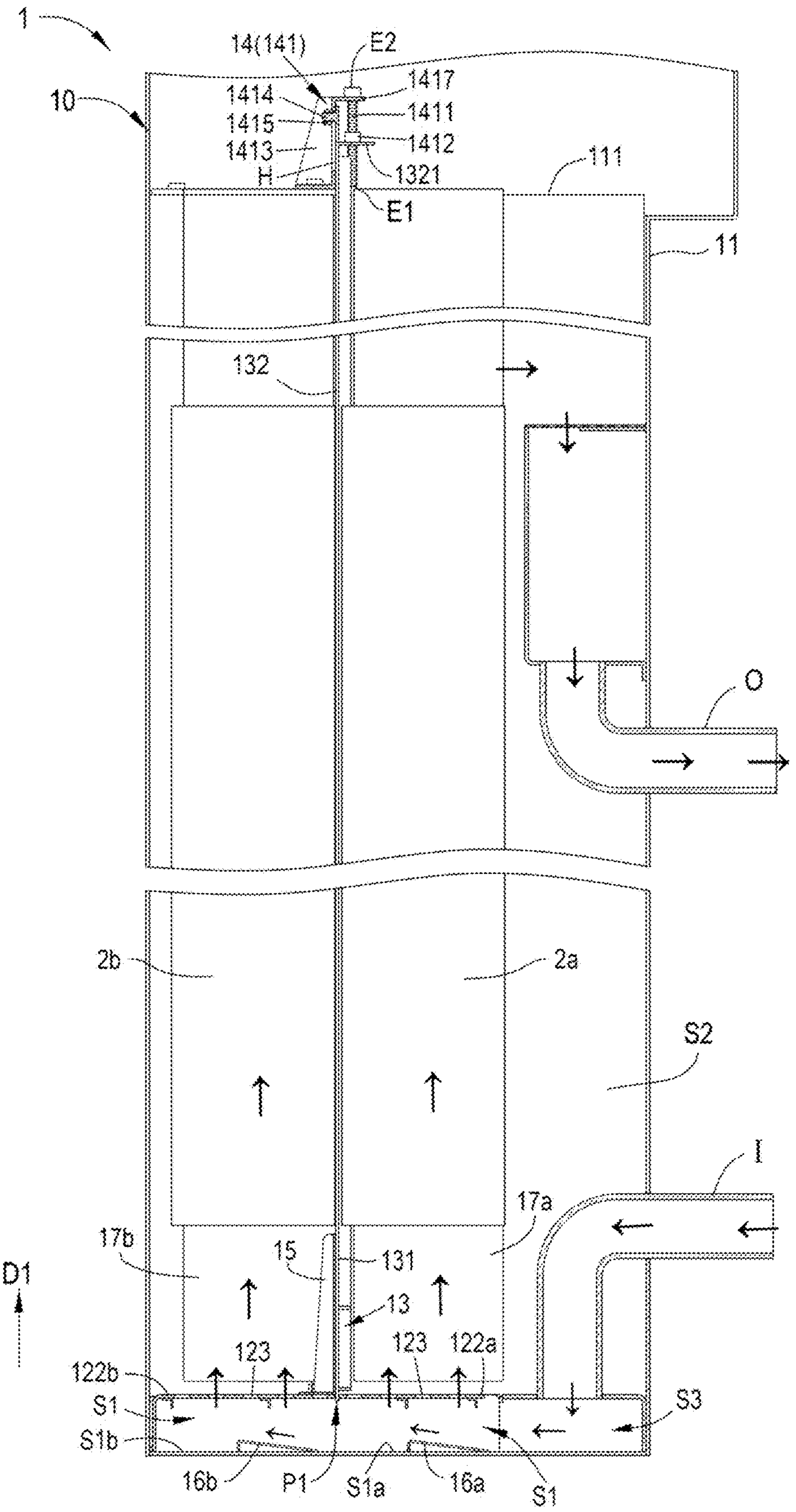
FIG. 6D is a schematic cross-sectional view of an adjustment plate that is of an adjustment structure of a cooling device in the cooling system in FIG. 1 and that is at a first position.
Figure 6E:
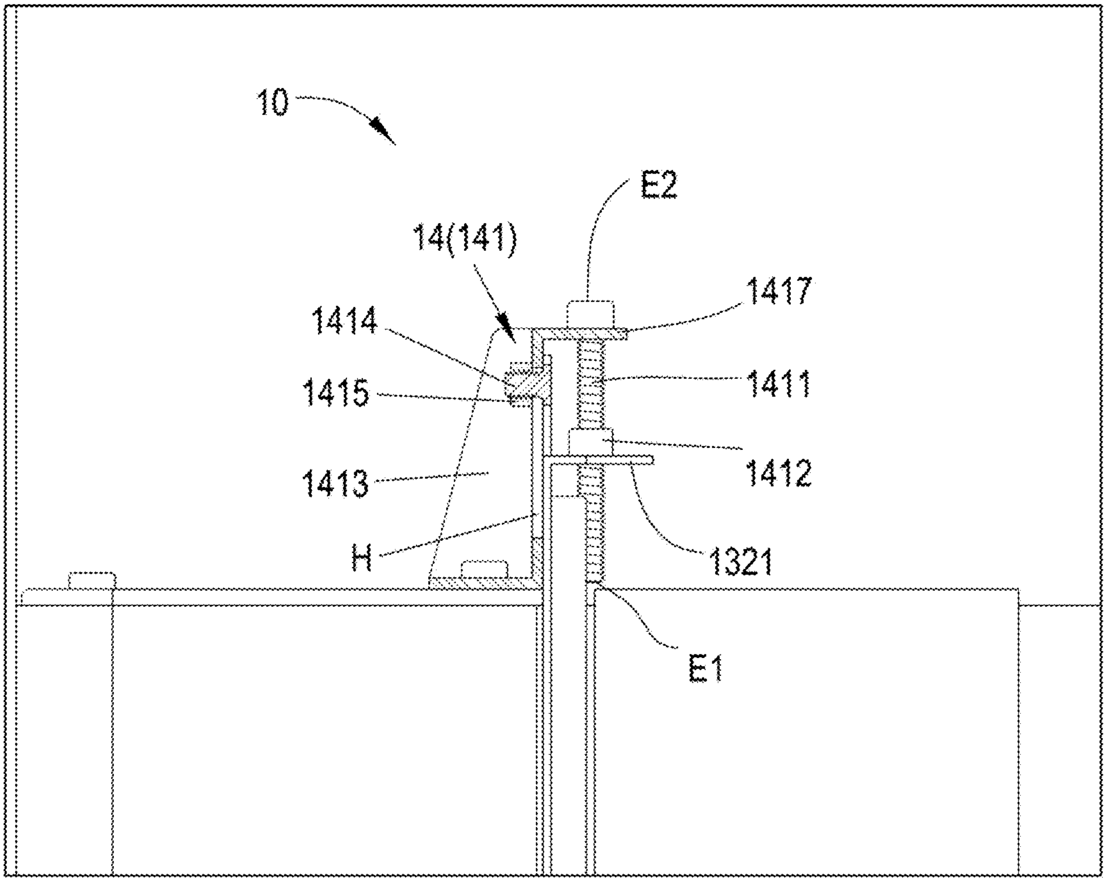
FIG. 6E is a schematic enlarged view of a control mechanism in FIG. 6D.
Figure 6F:
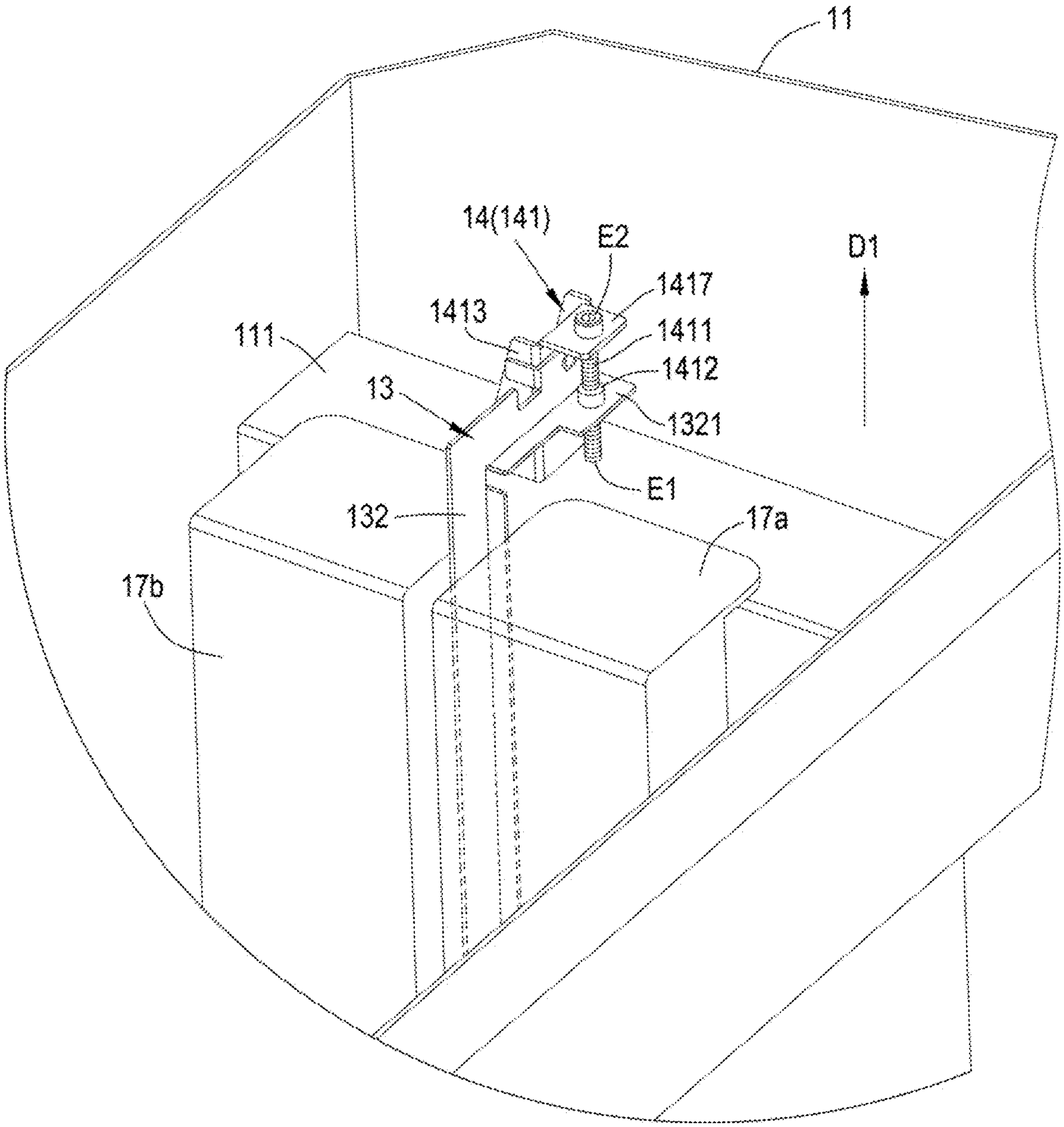
FIG. 6F is a schematic partial enlarged view of FIG. 6D.

FIG. 1 is a three-dimensional schematic diagram of a cooling system 1 according to an embodiment of the present invention; FIG. 2 and FIG. 3 are respectively partial three-dimensional schematic diagrams of the cooling system 1 in FIG. 1; FIG. 4 is a schematic diagram of a relationship among a turbulence plate 12, an adjustment structure 13, and a control mechanism 14 of a cooling device 10 in the cooling system 1 in FIG. 1; FIG. 5 is a partial three-dimensional schematic diagram of the cooling system 1 in FIG. 1; FIG. 6A is a schematic cross-sectional view of an adjustment plate 131 that is of an adjustment structure 13 of a cooling device 10 in the cooling system 1 in FIG. 1 and that is at a second position P2; FIG. 6B is a schematic enlarged view of a control mechanism 14 in FIG. 6A; FIG. 6C is a schematic partial enlarged view of FIG. 6A; FIG. 6D is a schematic cross-sectional view of an adjustment plate 131 that is of an adjustment structure 13 of a cooling device 10 in the cooling system 1 in FIG. 1 and that is at a first position P1; FIG. 6E is a schematic enlarged view of a control mechanism 14 in FIG. 6D; and FIG. 6F is a schematic partial enlarged view of FIG. 6D. To clearly show the relative relationship of the elements, FIG. 2, FIG. 3, FIG. 6C, and servers 2*a* and 2*b* are not drawn in FIG. 6F. In addition, to clearly show a relative relationship between the adjustment structure 13 and the turbulence plate 12, a baffle plate 15 is not drawn in FIG. 3 and FIG. 4.

Referring to FIG. 1 to FIG. 5 first, the cooling system 1 includes the cooling device 10 and at least two servers 2*a* and 2*b*. The cooling device 10 includes an accommodating tank 11, the turbulence plate 12, the adjustment structure 13, and the control mechanism 14. In addition, the cooling device 10 in this embodiment may further include the baffle plate 15. Herein, the cooling device 10 is applicable to an immersion cooling system, and an example in which the two servers 2*a* and 2*b* are cooled is used. However, the cooling device is not limited thereto. In different embodiments, the cooling device 10 may alternatively be used for cooling at least three servers.

The accommodating tank 11 is adapted to accommodate the servers 2*a* and 2*b* and a coolant, and includes a liquid inlet pipeline I and a liquid outlet pipeline O. The low-temperature and non-conductive coolant may enter the accommodating tank 11 through the liquid inlet pipeline I located on a lower side of the accommodating tank 11, pass through the servers 2*a* and 2*b*, and leave through the liquid outlet pipeline O located on an upper side of the accommodating tank, to take away heat generated by the servers 2*a* and 2*b*.

The turbulence plate 12 is disposed in the accommodating tank 11, to divide the accommodating tank 11 into a liquid inlet space S1 and a cooling space S2, and the servers 2*a* and 2*b* are located in the cooling space S2. Herein, the liquid inlet pipeline I is connected to a converging space S3 located in the accommodating tank 11, and the converging space S3 communicates with the liquid inlet space S1. Therefore, after the coolant enters the converging space S3 from the liquid inlet pipeline I, the coolant may enter the liquid inlet space S1 from the converging space S3, and then enter the cooling space S2 through the turbulence plate 12 to cool the servers 2*a* and 2*b*.

The turbulence plate 12 includes a groove 121 (FIG. 4). The groove 121 divides the turbulence plate 12 into a first plate portion 122*a* and a second plate portion 122*b*, and the first plate portion 122*a* and the second plate portion 122*b* are opposite to each other, and positions of the servers 2*a* and 2*b* respectively correspond to the first plate portion 122*a* and the second plate portion 122*b*. In other words, a position of the server 2*a* in the cooling space S2 is located on an upper side of the first plate portion 122*a*, and a position of the server 2*b* in the cooling space S2 is located on an upper side of the second plate portion 122*b*. Herein, the groove 121 extends in a direction D2 (extension direction), and the liquid inlet pipeline I and the first plate portion 122*a* are located on the same side of the groove 121, while the first plate portion 122*a* and the second plate portion 122*b* are located on two opposite sides of the groove 121, and have a plurality of communication holes 123. Therefore, the liquid inlet space S1 may communicate with the cooling space S2 through the communication holes 123, so that the coolant may enter the cooling space S2 from the liquid inlet space S1, to cool the servers 2*a* and 2*b*.

The adjustment structure 13 is movably disposed in the accommodating tank 11, and includes an adjustment plate 131 corresponding to the groove 121 (arrangement position corresponds to the groove 121). The adjustment plate 131 in this embodiment is located on a lower side of the adjustment structure 13 and may be considered as a gate for controlling a flow direction of the coolant, and a position and a size of the adjustment plate 131 correspond to those of the groove 121. When the adjustment structure 13 moves up and down in another direction D1 perpendicular to the direction D2, the adjustment plate 131 may pass through the groove 121.

The control mechanism 14 is disposed at the accommodating tank 11 and is connected to the adjustment structure 13, and the control mechanism 14 is adapted to control the adjustment plate 131 to move between the first position P1 and the second position P2. When the control mechanism 14 controls the adjustment plate 131 to move downward in the direction D1 from the first position P1 to the second position P2 (FIG. 5 and FIG. 6A), the adjustment plate 131 may pass through the groove 121 and enter the liquid inlet space S1, to divide the liquid inlet space S1 into a first chamber S1*a* corresponding to the first plate portion 122*a* and a second chamber S1*b* corresponding to the second plate portion 122*b*. Reversely, when the control mechanism 14 controls the adjustment plate 131 to move upward in the direction D1 from the second position P2 to the first position P1 (FIG. 6D), for the first chamber S1*a* and the second chamber S1*b*, spaces of the first chamber S1*a* and the second chamber S1*b* form the complete liquid inlet space S1 due to departure of the adjustment plate 131.

In detail, referring to FIG. 1 to FIG. 5 with reference to FIG. 6A to FIG. 6F, the control mechanism 14 includes a controller 141, and the controller 141 is fixed to a top 111 of the accommodating tank 11. In addition, the adjustment structure 13 further includes a connection portion 132, two ends of the connection portion 132 are respectively connected to the controller 141 and the adjustment plate 131. Therefore, the controller 141 may adjust a position of the adjustment plate 131 by using the connection portion 132, to cause the adjustment plate 131 to move in the direction D1 between the first position P1 and the second position P2. In this embodiment, both quantities of the connection portions 132 and the controllers 141 are two, in other words, the adjustment structure 13 has two connection portions 132, and the two connection portions 132 and the two controllers 141 are correspondingly disposed on two opposite inner side walls of the accommodating tank 11, and the two connection portions 132 are respectively connected to two sides of the adjustment plate 131. Herein, two fixing structures 17*a* are respectively disposed on the two inner side walls of the accommodating tank 11, and two fixing structures 17*b* are respectively disposed on the two inner side walls of the accommodating tank 11, the server 2*a* is disposed between the two fixing structures 17*a*, and the server 2*b* is disposed between the two fixing structures 17*b*. In addition, each connection portion 132 is sandwiched between the fixing structures 17*a* and 17*b*, and is movable upward and downward relative to the fixing structures 17*a* and 17*b* in the direction D1.

As shown in FIG. 6A, the foregoing second position P2 is a position when the adjustment structure 13 (adjustment plate 131) moves downward (closed). Therefore, the first chamber S1*a* and the second chamber S1*b* are blocked by the adjustment plate 131. Because the liquid inlet pipeline I communicates with the first chamber S1*a* through the converging space S3, the coolant that enters the first chamber S1*a* from the liquid inlet pipeline I through the converging space S3 cannot directly enter the second chamber S1*b*, and the coolant can only enter the cooling space S2 through the communication holes 123 of the first plate portion 122*a* first to cool the server 2*a*. In addition, as shown in FIG. 6D, the foregoing first position P1 is a position when the adjustment structure 13 (adjustment plate 131) moves upward (opened). As soon as the coolant enters the first chamber S1*a* from the liquid inlet pipeline I, the coolant can immediately flow into the second chamber S1*b*, and then enters the cooling space S2 through the communication holes 123 of the first plate portion 122*a* and the second plate portion 122*b* respectively to cool the servers 2*a* and 2*b*. A coolant with a higher temperature then flows out through the liquid outlet pipeline O, and after external heat exchange, a coolant with a lower temperature then enters the accommodating tank 11 from the liquid inlet pipeline I for a next cooling cycle.

Referring to FIG. 6D again, the baffle plate 15 is located in the cooling space S2 and disposed (fixed) on the turbulence plate 12 in the extension direction (direction D2) of the groove 121, and extends from one side of the groove 121 toward the servers 2*a* and 2*b* (the direction D1). Herein, a highest point of the baffle plate 15 is lower than bottoms of the servers 2*a* and 2*b*. In addition, when the adjustment plate 131 is at the first position P1 (an open position), the coolant that flows from the first chamber S1*a* to the second chamber S1*b* moves upward through the communication holes 123 of the second plate portion 122*b*, in other words, the coolant flows toward a left side of the cooling space S2 in FIG. 6D (a position of the server 2*b*). The coolant on the left side of the cooling space S2 can be blocked by the baffle plate 15 from quickly flowing back to a right side of the cooling space S2, and a flow direction of the coolant is adjusted to prevent the coolant that flows to the server 2*b* through the communication holes 123 of the second plate portion 122*b* from flowing back to the server 2*a*.

Referring to FIG. 5 and FIG. 6D simultaneously, the cooling system 1 in this embodiment may further include a first baffle 16*a* and a second baffle 16*b*, where the first baffle 16*a* and the second baffle 16*b* are respectively disposed in the first chamber S1*a* and the second chamber S1*b*, and extend in the extension direction (direction D2) of the groove 121. Herein, the first baffle 16*a* and the second baffle 16*b* are disposed on an inner bottom of the accommodating tank 11. In addition, thicknesses of the first baffle 16*a* and the second baffle 16*b* gradually increase in a direction away from the liquid inlet pipeline I. In other words, for the first baffle 16*a*, a height of a side away from the liquid inlet pipeline I is greater than a height of a side close to the liquid inlet pipeline I, and for the second baffle 16*b*, a height of a side away from the liquid inlet pipeline I is greater than a height of a side close to the liquid inlet pipeline I. Specifically, cross sections of the first baffle 16*a* and the second baffle 16*b* in this embodiment each form a triangle (FIG. 6D), where there is a feature that a part close to the liquid inlet pipeline I is lower and a part away from the liquid inlet pipeline I is higher. In this way, except that the coolant can be concentrated to flow to the cooling space S2 on the upper side, the coolant entering the liquid inlet space S1 from the liquid inlet pipeline I can also be prevented from flowing back.

It is reminded that, in an existing immersion cooling system, the accommodating tank is not provided with the adjustment structure (the adjustment plate). Therefore, after the coolant enters the liquid inlet space of the accommodating tank from the liquid inlet pipeline, the coolant immediately flows to a space corresponding to the second chamber and then flows to an upper side to cool the servers. As a result, heat dissipation efficiency of the servers on two sides is inconsistent (generally, a cooling effect of a server corresponding to the second chamber is better), leading to a risk of local overheating of the servers and a requirement for increased pump power consumption.

However, in the cooling system 1 in this embodiment, by controlling a position of the adjustment structure 13 (adjustment plate 131) through the control mechanism 14 (controller 141), a flow direction of the coolant can be changed, and a flow amount of the coolant that flows from the first chamber S1*a* to the second chamber S1*b* can be adjusted. In other words, flow amounts of the coolant that flows to the servers 2*a* and 2*b* (cooling space S2) can be adjusted based on heat dissipation requirements of the servers 2*a* and 2*b*, so that the servers 2*a* and 2*b* can both achieve better heat dissipation efficiency. In addition, a problem of increased pump power consumption caused by a requirement for increasing a flow rate of the coolant due to overheating of local hot spots in certain server can also be avoided.

The following describes in detail how to adjust the position of the adjustment structure 13 (adjustment plate 131) through the control mechanism 14. Manners of adjusting the adjustment structure 13 may be classified into manual adjustment or electric adjustment.

The manual adjustment is used as an example. Referring to FIG. 6A to FIG. 6F again, the controller 141 in this embodiment includes an adjustment rod 1411 perpendicular to the turbulence plate 12, and a mating piece 1412 disposed corresponding to the adjustment rod 1411. The mating piece 1412 is connected (fixed) to a bent region 1321 of the connection portion 132. Herein, the adjustment rod 1411 may be, for example, a screw rod and have a first end E1 and a second end E2 that are opposite to each other, and the mating piece 1412 may be, for example, a nut that cooperates (engages) with the screw rod. The first end E1 of the adjustment rod 1411 passes through the mating piece 1412 and the bent region 1321. When the adjustment rod 1411 is rotated, for example, when the second end E2 of the adjustment rod 1411 (screw) is rotated by using a wrench, an engagement effect between the adjustment rod 1411 and the mating piece 1412 may drive the mating piece 1412 and the bent region 1321 (connection portion 132) to move upward or downward in the direction D1 (for example, change from FIG. 6B to FIG. 6E), to further drive the adjustment plate 131 to move between the first position P1 and the second position P2, so as to adjust a flow direction and a flow amount of the coolant through the adjustment plate 131.

In addition, to enable the adjustment structure 13 to stably move in the direction D1, the controller 141 in this embodiment further includes a fixing base 1413 and a guide piece 1414. The fixing base 1413 has a protruding portion 1417 and a guide slot H, an extension direction of the guide slot H is perpendicular to the turbulence plate 12. The second end E2 of the adjustment rod 1411 passes through the protruding portion 1417. The guide piece 1414 is fixed to the connection portion 132 and movably passes through the guide slot H, so that when the adjustment structure 13 moves up and down, the movement of the adjustment structure becomes more stable under guidance of the guide piece 1414 and the guide slot H. Herein, the guide piece 1414 may be, for example, a screw used in cooperation with a locking piece 1415, to ensure that the guide piece 1414 can stably move up and down in the guide slot H to exert an effect of guiding the connection portion 132. In addition, in an embodiment, scales may be provided on a side surface of the fixing base 1413 (referring to FIG. 7A), so that a height (or position) when the adjustment plate 131 is opened is learned.

Figure 7A:
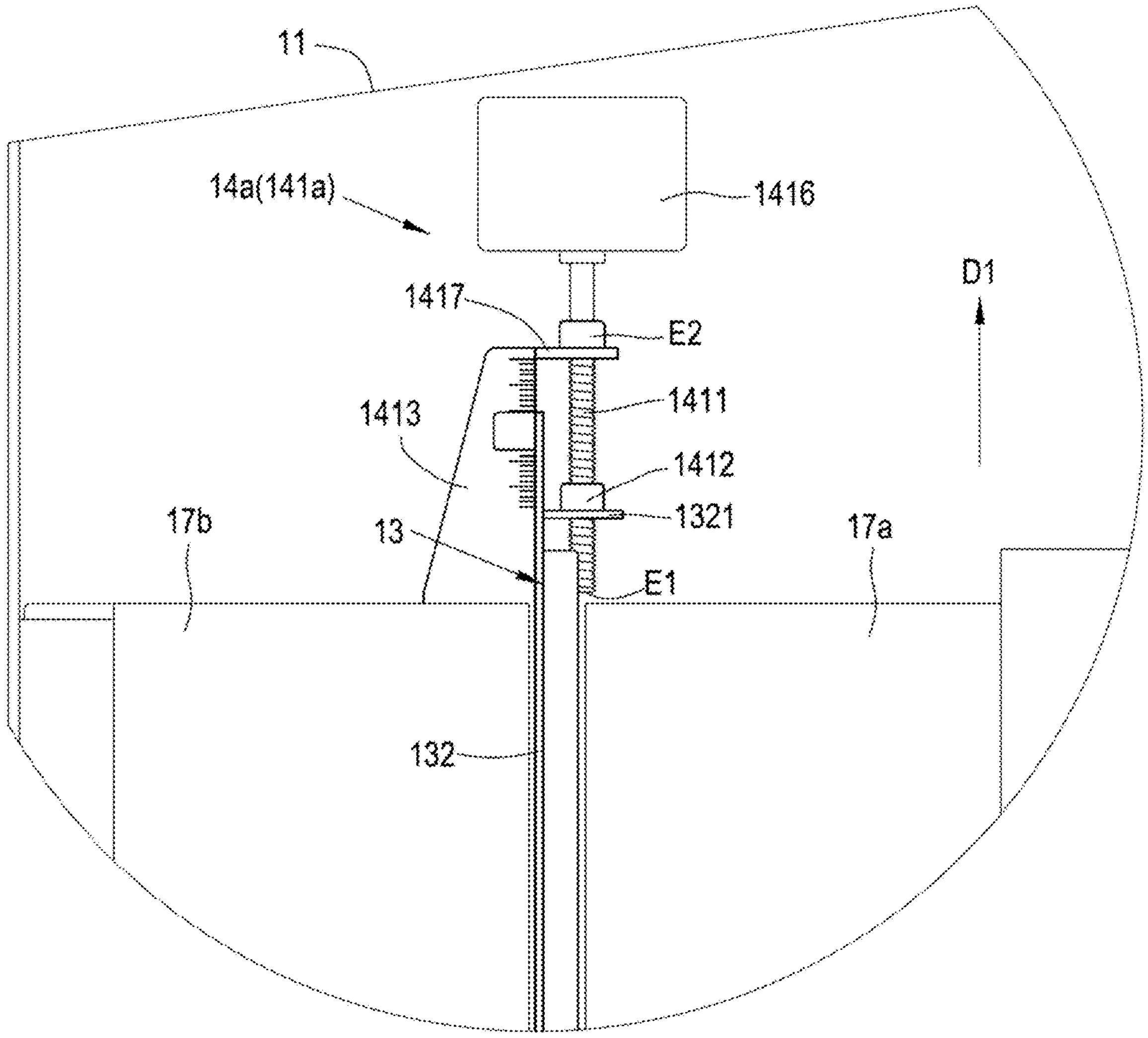
FIG. 7A is a schematic enlarged view of another embodiment of the control mechanism in FIG. 6D.
Figure 7B:
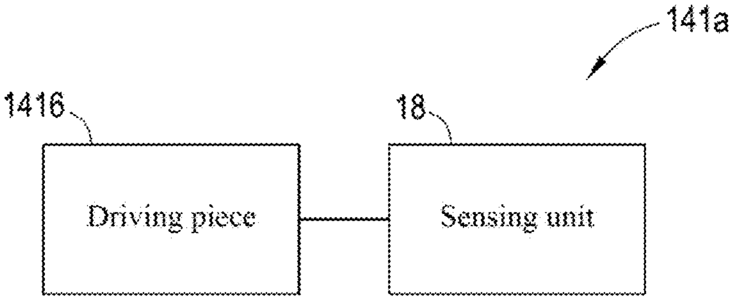
FIG. 7B is a functional block diagram of a controller in FIG. 7A.

FIG. 7A is a schematic enlarged view of another embodiment of the control mechanism in FIG. 6D, and FIG. 7B is a functional block diagram of the controller 141*a* in FIG.

7A. Herein, for the control mechanism 14*a* in FIG. 7A and FIG. 7B, an example in which the adjustment structure 13 is adjusted in an electric manner is used.

As shown in FIG. 7A and FIG. 7B, the control mechanism 14*a* is substantially the same as the control mechanism 14 in the foregoing embodiments. A main difference from the control mechanism 14 in the foregoing embodiments lies in that the controller 141*a* of the control mechanism 14*a* of this embodiment may further include a driving piece 1416 and a sensing unit 18 (electrically) connected to the driving piece 1416. For example, the driving piece 1416 includes but is not limited to a motor (and a speed change gear), to drive the second end E2 of the adjustment rod 1411 to rotate, so as to drive the adjustment plate 131 to move between the first position P1 and the second position P2.

The sensing unit 18 is adapted to sense temperatures of the servers 2*a* and 2*b*. When a temperature of the one of the servers corresponding to the first plate portion 122*a* (the server 2*a*) is greater than a temperature of the another one of the servers corresponding to the second plate portion 122*b* (the server 2*b*), the driving piece 1416 may drive the adjustment rod 1411 to rotate to cause the adjustment plate 131 to move from the first position P1 to the second position P2. A flow amount of the coolant that flows from the first chamber S1*a* to the second chamber S1*b* is reduced by using partition of the adjustment plate 131, to increase a flow amount of the coolant that flows from the first chamber S1*a* to the server 2*a*, thereby enhancing a heat dissipation effect on the server 2*a*. In an embodiment, the sensing unit 18 may include at least two temperature sensors respectively disposed in the servers 2*a* and 2*b*.

In addition, other technical features of the control mechanism 14*a* are the same as those of the control mechanism 14 in the foregoing embodiments, and details are not described again.

In summary, in the cooling device and the cooling system of the present invention, the control mechanism controls the adjustment structure (adjustment plate) to move between the first position and the second position, where when the control mechanism controls the adjustment plate to move from the first position to the second position, the adjustment plate passes through the groove of the turbulence plate and enters the liquid inlet space, to divide the liquid inlet space into the first chamber and the second chamber respectively corresponding to the first plate portion and the second plate portion of the turbulence plate, so that the cooling system of the present invention can change a flow direction of the coolant entering the accommodating tank, and adjust a flow amount of the coolant entering the cooling space from the first chamber and the second chamber, to achieve better heat dissipation efficiency in cooperation with heat dissipation requirements of the servers at different positions. In addition, a problem of increased pump power consumption caused by a requirement for increasing a flow rate of the coolant due to overheating of local hot spots in the servers can be avoided.

The foregoing descriptions are merely exemplary rather than limitative. Any equivalent modification or change made without departing from the spirit and scope of the present invention shall fall within the scope of the appended claims.

What is claimed is:

1. A cooling device, comprising:

an accommodating tank, adapted to accommodate a coolant;

a turbulence plate, disposed in the accommodating tank, to divide the accommodating tank into a liquid inlet space and a cooling space, wherein the turbulence plate comprises a groove, the groove divides the turbulence plate into a first plate portion and a second plate portion, and the first plate portion and the second plate portion are opposite to each other and have a plurality of communication holes communicating the liquid inlet space with the cooling space;

an adjustment structure, movably disposed in the accommodating tank, and comprising an adjustment plate corresponding to the groove; and a control mechanism, disposed at the accommodating tank, and connected to the adjustment structure, wherein the control mechanism is adapted to control the adjustment plate to move between a first position and a second position, wherein when the adjustment plate moves from the first position to the second position, the adjustment plate passes through the groove and enters the liquid inlet space, to divide the liquid inlet space into a first chamber corresponding to the first plate portion and a second chamber corresponding to the second plate portion.

2. The cooling device according to claim 1, wherein the accommodating tank comprises a liquid inlet pipeline and a converging space connected to the liquid inlet pipeline, and the converging space communicates with the first chamber.

3. The cooling device according to claim 2, further comprising:

a first baffle and a second baffle, respectively disposed in the first chamber and the second chamber and extending in an extension direction of the groove, wherein thicknesses of the first baffle and the second baffle gradually increase in a direction away from the liquid inlet pipeline.

4. The cooling device according to claim 1, wherein the control mechanism comprises a controller, the adjustment structure further comprises a connection portion, two ends of the connection portion are respectively connected to the controller and the adjustment plate, and the controller is fixed to a top of the accommodating tank, and drives the adjustment plate to move between the first position and the second position by using the connection portion.

5. The cooling device according to claim 4, wherein the controller comprises an adjustment rod perpendicular to the turbulence plate and a mating piece disposed corresponding to the adjustment rod, the connection portion further comprises a bent region, the mating piece is connected to the bent region of the connection portion, and an end of the adjustment rod passes through the mating piece and the bent region.

6. The cooling device according to claim 5, wherein when the adjustment rod is rotated, the adjustment rod drives the adjustment plate to move between the first position and the second position by using the mating piece and the connection portion.

7. The cooling device according to claim 5, wherein the controller further comprises a driving piece, and the driving piece is adapted to drive the adjustment rod to rotate.

8. The cooling device according to claim 5, wherein the controller further comprises a fixing base and a guide piece, the fixing base is disposed at the top of the accommodating tank and has a guide slot, an extension direction of the guide slot is perpendicular to the turbulence plate, another end of the adjustment rod is connected to the fixing base, and the guide piece is fixed to the connection portion and movably penetrates the guide slot.

9. The cooling device according to claim 1, further comprising a baffle plate, wherein the baffle plate is located in the cooling space and is disposed on the turbulence plate in an extension direction of the groove.

10. A cooling system, comprising:

at least two servers;

an accommodating tank, adapted to accommodate the at least two servers and a coolant;

a turbulence plate, disposed in the accommodating tank, to divide the accommodating tank into a liquid inlet space and a cooling space, wherein the at least two servers are located in the cooling space, the turbulence plate comprises a groove, the groove divides the turbulence plate into a first plate portion and a second plate portion, and the first plate portion and the second plate portion are opposite to each other and have a plurality of communication holes communicating the liquid inlet space with the cooling space;

an adjustment structure, movably disposed in the accommodating tank, and comprising an adjustment plate corresponding to the groove; and a control mechanism, disposed at the accommodating tank, and connected to the adjustment structure, wherein the control mechanism is adapted to control the adjustment plate to move between a first position and a second position, wherein when the adjustment plate moves from the first position to the second position, the adjustment plate passes through the groove and enters the liquid inlet space, to divide the liquid inlet space into a first chamber corresponding to the first plate portion and a second chamber corresponding to the second plate portion.

11. The cooling system according to claim 10, wherein a position of one of the at least two servers in the cooling space corresponds to the first plate portion, and a position of another one of the at least two servers in the cooling space corresponds to the second plate portion.

12. The cooling system according to claim 10, wherein the control mechanism comprises a controller, the adjustment structure further comprises a connection portion, two ends of the connection portion are respectively connected to the controller and the adjustment plate, and the controller is fixed to a top of the accommodating tank, and drives the adjustment plate to move between the first position and the second position by using the connection portion.

13. The cooling system according to claim 12, wherein the controller comprises an adjustment rod perpendicular to the turbulence plate and a mating piece disposed corresponding to the adjustment rod, the connection portion further comprises a bent region, the mating piece is connected to the bent region of the connection portion, and an end of the adjustment rod passes through the mating piece and the bent region.

14. The cooling system according to claim 13, wherein the controller further comprises a driving piece, and the driving piece is adapted to drive the adjustment rod to rotate.

15. The cooling system according to claim 14, wherein a position of one of the at least two servers in the cooling space corresponds to the first plate portion, and a position of another one of the at least two servers in the cooling space corresponds to the second plate portion; and the controller further comprises a sensing unit connected to the driving piece, wherein the sensing unit is adapted to sense temperatures of the at least two servers, and when a temperature of the one of the at least two servers corresponding to the first plate portion is greater than a temperature of the other one of the at least two servers corresponding to the second plate portion, the driving piece drives the adjustment rod to rotate to cause the adjustment plate to move from the first position to the second position.

* * * * *